US010203830B2

(12) United States Patent
Liu et al.

(10) Patent No.: US 10,203,830 B2
(45) Date of Patent: Feb. 12, 2019

(54) ELECTRONIC DEVICE, MANUFACTURING METHOD AND OPERATION METHOD THEREOF, ELECTRONIC COPY SYSTEM

(71) Applicant: BOE Technology Group Co., Ltd., Beijing (CN)

(72) Inventors: Yingwei Liu, Beijing (CN); Ning Chen, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/778,310

(22) PCT Filed: May 25, 2017

(86) PCT No.: PCT/CN2017/085920
§ 371 (c)(1),
(2) Date: May 23, 2018

(87) PCT Pub. No.: WO2018/086335
PCT Pub. Date: May 17, 2018

(65) Prior Publication Data
US 2018/0356920 A1    Dec. 13, 2018

(30) Foreign Application Priority Data

Nov. 11, 2016    (CN) .......................... 2016 1 0995315

(51) Int. Cl.
*G06F 3/046*    (2006.01)
*H01L 27/12*    (2006.01)
(Continued)

(52) U.S. Cl.
CPC .......... *G06F 3/046* (2013.01); *G06F 3/03545* (2013.01); *H01L 27/124* (2013.01);
(Continued)

(58) Field of Classification Search
CPC ................. G06F 3/046; G06F 3/03545; G06F 2203/04103; H01L 27/124; H01L 27/22; H01L 43/04; H01L 43/065; H01L 43/14
See application file for complete search history.

(56) References Cited

U.S. PATENT DOCUMENTS 9,465,207 B1    10/2016  Novoselov et al.
2009/0050949 A1*   2/2009  Maruyama .............. G11C 11/22
                                                257/295
(Continued)

FOREIGN PATENT DOCUMENTS

CN    101997004 A    3/2011
CN    103630854 A    3/2014
CN    106648277 A    5/2017

OTHER PUBLICATIONS

Aug. 31, 2017—International Search Report and Written Opinion Appn PCT/CN2017/085920 with Eng Tran.

*Primary Examiner* — Ariel A Balaoing
(74) *Attorney, Agent, or Firm* — Banner & Witcoff, Ltd.

(57) ABSTRACT

An electronic device, a manufacturing method and an operation method thereof, and an electronic copy system. Each pixel unit of the electronic device includes a Hall-effect working electrode including a first, second, third and fourth contact position, a thin film transistor, a gate line, a first common line, a second common line, a data line and a sensing line. A line connecting the first contact position and the second contact position intersects a line connecting the third contact position and the fourth contact position; the thin film transistor includes a gate electrode connected with the gate line, a source electrode connected with the data line and a drain electrode, the drain electrode and sensing line are respectively connected with the first and second contact position; the first and second common line are respectively (Continued)

connected with the Hall-effect working electrode through the third and fourth contact position.

15 Claims, 6 Drawing Sheets

(51) Int. Cl.
  *H01L 27/22* (2006.01)
  *H01L 43/04* (2006.01)
  *H01L 43/06* (2006.01)
  *H01L 43/14* (2006.01)
  *G06F 3/0354* (2013.01)
(52) U.S. Cl.
  CPC .......... *H01L 27/1262* (2013.01); *H01L 27/22* (2013.01); *H01L 43/04* (2013.01); *H01L 43/065* (2013.01); *H01L 43/14* (2013.01); *G06F 2203/04103* (2013.01)

(56) References Cited

U.S. PATENT DOCUMENTS

| | | | | |
|---|---|---|---|---|
| 2010/0301328 | A1* | 12/2010 | Yamazaki | H01L 29/4908 257/43 |
| 2013/0333023 | A1* | 12/2013 | Park | G06F 21/31 726/19 |
| 2016/0054835 | A1* | 2/2016 | Heo | G06F 3/0412 345/173 |
| 2016/0202507 | A1* | 7/2016 | Ebisui | B43L 1/008 345/174 |
| 2016/0349921 | A1* | 12/2016 | Mizuhashi | G06F 3/046 |
| 2018/0246598 | A1* | 8/2018 | Sainis | G06F 3/044 |

* cited by examiner

ELECTRONIC DEVICE, MANUFACTURING METHOD AND OPERATION METHOD THEREOF, ELECTRONIC COPY SYSTEM

The application is a U.S. National Phase Entry of International Application No. PCT/CN2017/085920 filed on May 25, 2017, designating the United States of America and claiming priority to Chinese Patent Application No. 201610995315.3, filed Nov. 11, 2016. The present application claims priority to and the benefit of the above-identified applications and the above-identified applications are incorporated by reference herein in their entirety.

TECHNICAL FIELD

Embodiments of the present disclosure relate to an electronic device, a manufacturing method and an operation method thereof, and an electronic copy system.

BACKGROUND

Although electronic devices such as mobile phones and tablet computers have been widely used, many people still keep a habit of writing. This is due to a fact that the experience of writing on paper is irreplaceable by a touch screen and a handwriting tablet. In addition, the drawings and the like can be modified and annotated conveniently when writing on papers. However, storage of paper documents needs to occupy a large amount of space and it is not easy to carry and transport the paper documents. Therefore, electronization of texts and images written on papers is an urgent problem to solve.

SUMMARY

An embodiment of the present disclosure provides an electronic device, and the electronic device comprises a plurality of pixel units arranged in an array, each pixel unit comprises a Hall-effect working electrode, a thin film transistor, a gate line, a first common line, a second common line, a data line and a sensing line. The Hall-effect working electrode comprises a first contact position, a second contact position, a third contact position, and a fourth contact position, and a line connecting the first contact position and the second contact position intersects a line connecting the third contact position and the fourth contact position; the thin film transistor comprises a gate electrode, a source electrode and a drain electrode, the drain electrode is electrically connected with the first contact position; the gate line is electrically connected with the gate electrode; the first common line is electrically connected with the Hall-effect working electrode through the third contact position; the second common line is electrically connected with the Hall-effect working electrode through the fourth contact position; the data line is electrically connected with the source electrode; and the sensing line is electrically connected with the second contact position.

Another embodiment of the present disclosure provides an operation method for an electronic device, and the operation method comprises: applying a scan voltage to the gate line, so as to turn on the thin film transistor in a pixel unit connected to the gate line; applying a first current to the Hall-effect working electrode through the first common line and the second common line; detecting a Hall voltage signal of the Hall-effect working electrode through the data line and the sensing line, in which whether this pixel unit is operated or not is determined according to the Hall voltage signal.

Yet another embodiment of the present disclosure provides an electronic copy system, and the electronic copy system comprises a magnetic pen and the above-mentioned electronic device.

Still yet another embodiment of the present disclosure provides a manufacturing method of an electronic device, and the manufacturing method comprises forming a Hall-effect working electrode, the Hall-effect working electrode comprising a first contact position, a second contact position, a third contact position, and a fourth contact position, and a line connecting the first contact position and the second contact position intersecting a line connecting the third contact position and the fourth contact position; forming a thin film transistor, the thin film transistor comprising a gate electrode, a source electrode and a drain electrode, and the drain electrode being electrically connected with the first contact position; forming a gate line, the gate line being electrically connected with the gate electrode; forming a first common line, the first common line being electrically connected with the Hall-effect working electrode through the third contact position; forming a second common line, the second common line being electrically connected with the Hall-effect working electrode through the fourth contact position; forming a data line, the data line being electrically connected with the source electrode; and forming a sensing line, the sensing line being electrically connected with the second contact position.

BRIEF DESCRIPTION OF THE DRAWINGS

In order to clearly illustrate the technical solutions of the embodiments of the disclosure, the drawings required for describing the embodiments or related technologies will be briefly described in the following; it is obvious that the described drawings are only related to some embodiments of the present disclosure and thus are not limitative to the present disclosure.

DETAILED DESCRIPTION

The technical solutions of the embodiments will be described in a clearly and fully understandable way below in connection with the accompanying drawings, referring to the non-limiting exemplary embodiments illustrated in the accompanying drawings and detailed described in the following description, the exemplary embodiments of the present disclosure and their various features and advantageous details are described comprehensively. It should be noted that, the features illustrated in figures are not necessarily to be drawn in a real scale. The description of the known material(s), component(s) and process technology can be omitted in the present disclosure, so that the exemplary embodiments of the present disclosure are not obscured. The examples provided are merely intended to be beneficial for understanding the implementation of the exemplary embodiments of the present disclosure, and further enable one of ordinary skill in the art to which the present disclosure belongs to implement the exemplary embodiments. Therefore, the examples should not be construed as a limitation of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but to distinguish various components. In addition, in respective embodiments of the present disclosure, same or similar reference numerals represent same or similar components.

Embodiments of the present disclosure provide an electronic device and a manufacturing method thereof, an electronic copy system, and an operation method of an electronic device, and Hall-effect is adopted to allow writing information to be transformed into images.

At least one embodiment of the present disclosure provides an electronic device, and the electronic device comprises a plurality of pixel units arranged in an array, each pixel unit comprises a Hall-effect working electrode, a thin film transistor, a gate line, a first common line, a second common line, a data line and a sensing line. The Hall-effect working electrode comprises a first contact position, a second contact position, a third contact position, and a fourth contact position, and a line connecting the first contact position and the second contact position intersects a line connecting the third contact position and the fourth contact position; the thin film transistor comprises a gate electrode, a source electrode and a drain electrode, the drain electrode is electrically connected with the first contact position; the gate line is electrically connected with the gate electrode; the first common line is electrically connected with the Hall-effect working electrode through the third contact position; the second common line is electrically connected with the Hall-effect working electrode through the fourth contact position; the data line is electrically connected with the source electrode; and the sensing line is electrically connected with the second contact position.

Figure 1:
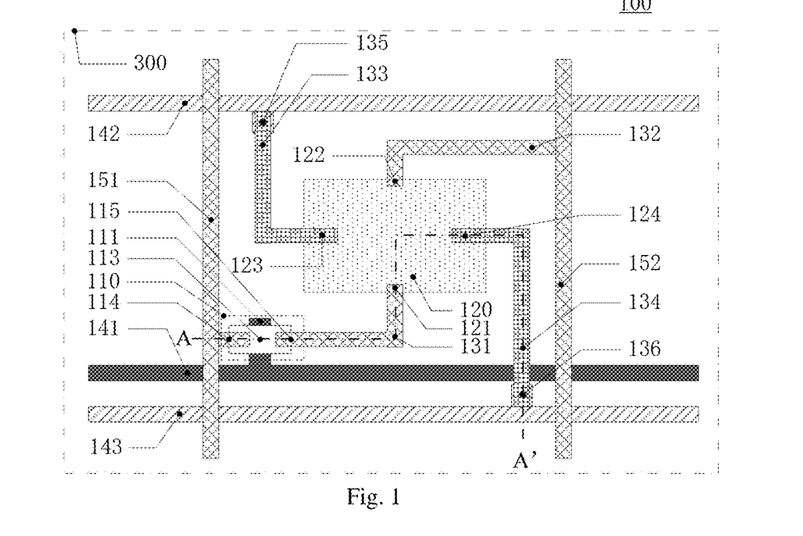
FIG. 1 is a plan view of an electronic device provided by an embodiment of the present disclosure.
Figure 2:
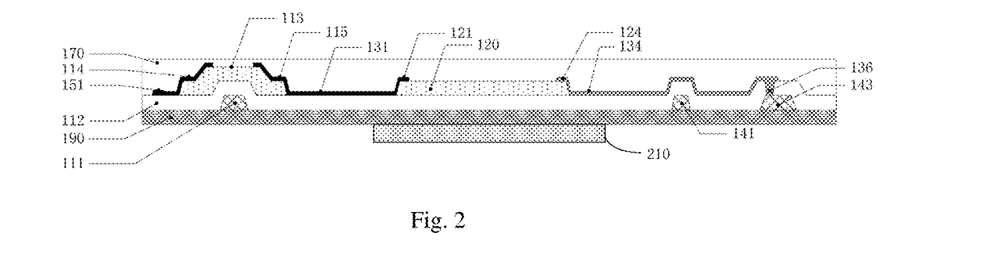
FIG. 2 is a cross-sectional view of the electronic device illustrated in FIG. 1 along an A-A' line.

For example, FIG. 1 and FIG. 2 respectively illustrate a plan view and a cross-sectional view of an electronic device provided by an embodiment of the present disclosure, and the cross-sectional view illustrated in FIG. 2 is obtained by sectioning along an A-A' line illustrated in FIG. 1.

As illustrated in FIG. 1 and FIG. 2, the electronic device 100 comprises a plurality of pixel units 300 arranged in an array on a base substrate, each pixel unit 300 comprises a thin film transistor 110, a Hall-effect working electrode 120, a gate line 141, a first common line 142, a second common line 143, a data line 151 and a sensing line 152, which are disposed on the base substrate 190. These pixel units 300 can be defined by the gate line 141 and the data line 151 intersecting with each other.

The Hall-effect working electrode 120 comprises a first contact position 121, a second contact position 122, a third contact position 123, and a fourth contact position 124, and a line connecting the first contact position 121 and the second contact position 122 intersects a line connecting the third contact position 123 and the fourth contact position 124; the thin film transistor 110 comprises a gate electrode 111, a gate insulating layer 112, a semiconductor pattern 113, a source electrode 114 and a drain electrode 115; the drain electrode 115 is electrically connected with the first contact position 121; the gate line 141 is electrically connected with the gate electrode 111; the first common line 142 is electrically connected with the Hall-effect working electrode 120 through the third contact position 123; the second common line 143 is electrically connected with the Hall-effect working electrode 120 through the fourth contact position 124; the data line 151 is electrically connected with the source electrode 114; and the sensing line 152 is electrically connected with the second contact position 122.

For example, in the embodiment of the present disclosure, a first current is applied to the Hall-effect working electrode 120 through the first common line 142 and the second common line 143, in a case that a magnetic field component B (i.e., a direction of the magnetic field component B is perpendicular to the paper surface) perpendicular to a direction of the first current I (i.e., a direction along the line connecting the third contact position 123 and the fourth contact position 124) exists in an area where the Hall-effect working electrode 120 locates, a Hall voltage V is generated along a direction perpendicular to both the first current I and the magnetic field component B. Therefore, a voltage difference between the first contact position 121 and the second contact position 122 can exist. When a scan voltage is applied to the gate line 141 and the thin film transistor 110 in a pixel unit connected to the gate line 141 is turned on, a Hall voltage signal generated on the Hall-effect working electrode 120 can be detected by the data line 151 and the sensing line 152, and it can be determined whether the pixel unit 300 is operated or not according to the Hall voltage signal (that is, whether a hall working area is applied with the magnetic field component B or not). When the plurality of pixel units 300, arranged in an array, is scanned, it can be determined whether each pixel unit 300 is operated or not, so that a corresponding image formed by the plurality of pixel units 300 can be obtained and transformation of writing information to images can be achieved.

For example, in the embodiment of the present disclosure, the line connecting the first contact position 121 and the second contact position 122 and the line connecting the third contact position 123 and the fourth contact position 124 can be perpendicular to each other. In such a case, a component of the Hall voltage V obtained through the third contact position 123 and the fourth contact position 124 is the largest, so that the signal-to-noise ratio of the Hall voltage signal detected by the data line 151 and the image quality of the obtained image can be improved.

For example, in the embodiment of the present disclosure, in order to further improve the signal-to-noise ratio of the Hall voltage signal and the image quality of the obtained image, a magnetic material layer 210 can also be provided (for instance, as illustrated in FIG. 2). The magnetic material layer 210 is disposed at a side of the Hall-effect working electrode 120 away from a working surface of the electronic device 100, as illustrated in FIG. 2, the working surface of the electronic device 100 is, for example, an upper surface, and the magnetic material layer 210 is disposed on a lower surface of the base substrate 190, obviously, the magnetic material layer 210 can also be disposed on an upper surface of the base substrate 190, and separated from the Hall-effect working electrode 120 by, for example, an insulating layer. In such a case, the magnetic field component B perpendicular to the first current I can be increased, so that the signal-to-noise ratio of the Hall voltage signal and the image quality of the obtained image can be improved.

For example, the magnetic material layer can be formed by a permanent magnetic material and/or a hard magnetic material, or can be obtained by an electromagnetic coil. For example, the magnetic material layer can be made of one or a combination of electrical steel, nickel-based alloy, rare earth doped alloy, or ferrite material. For example, the magnetic material layer can be disposed on a side of the base substrate away from the Hall-effect working electrode 120, in such a case, a manufacturing process of the magnetic material layer is simple, and it is easy to repair the magnetic material layer when the magnetic force of the magnetic material layer is weakened. For example, the magnetic material layer can be disposed on a side of the base substrate closer to the Hall-effect working electrode 120 or on a side of the gate insulating layer 120 closer to the Hall-effect working electrode 120, so as to reduce the thickness of the electronic device 100.

For example, an entire magnetic material layer can be provided, so that the manufacturing process is simple. For another example, the magnetic material layer can be disposed only under the Hall-effect working electrode 120, so as to avoid an influence of the magnetic field on the gate line 141, the first common line 142, the second common line 143 and the data line 151. For example, the magnetic material layer can be provided by bonding. For another example, the magnetic material layer can also be obtained by firstly depositing a raw material for manufacturing a magnetic material on the base substrate or the gate insulating layer 112, and then applying a magnetic field to the raw material to allow the raw material to possess magnetism.

For example, the base substrate 190 illustrated in FIG. 2 can be a glass substrate, a quartz substrate, a plastic substrate (such as a polyethylene terephthalate (PET) substrate), or substrates made of other suitable materials.

For example, as illustrated in FIG. 1 and FIG. 2, the gate electrode 111, the gate line 141, the first common line 142 and the second common line 143 can be formed on the base substrate in same one patterning process; the gate line 141, the first common line 142 and the second common line 143 are parallel to each other, and the gate electrode 111 is obtained by bifurcating from the gate line 141. The gate electrode 111, the gate line 141, the first common line 142 and the second common line 143 can be formed of, for example, a metal material (such as, copper, aluminum, or aluminum alloy). For example, a thickness of a metal layer for forming the gate electrode 111 can be equal to a thickness of a metal layer for forming the gate line 141.

For example, the gate insulating layer 121 can be disposed on the base substrate on which the gate electrode 111, the gate line 141, the first common line 142, and the second common line 143 are formed. For example, a material for forming the gate insulating layer 112 can be silicon oxide (SiOx), silicon oxynitride (SiNxOy), silicon nitride (SiNx) or other suitable materials.

For example, the semiconductor pattern 113 and the Hall-effect working electrode 120 can be disposed on the gate insulating layer 112. For example, a material for forming the semiconductor pattern 113 can be intrinsic amorphous silicon (I-a-Si), amorphous silicon (n$^+$-a-Si) doped with n+ions, hydrogenated amorphous silicon (a-Si: H), IGZO or other suitable materials. For example, the Hall-effect working electrode 120 can be formed of a conductive material or a semiconductor material. For example, a material for forming the Hall-effect working electrode 120 can be amorphous silicon, polysilicon, gallium arsenide (GaAs), indium stibide (InSb), indium arsenide (InAs), IGZO or other suitable materials.

For example, the Hall-effect working electrode 120 can be formed in a same layer as the semiconductor pattern 113, In such a case, the Hall-effect working electrode 120 can be made of a semiconductor material, because the semiconductor material has a large Hall coefficient and the Hall voltage V is proportional to the Hall coefficient, so that the signal-to-noise ratio of the Hall voltage signal and the image quality of the obtained image can be improved. In addition, because the manufacturing process of the Hall-effect working electrode 120 in such a case is compatible with the manufacturing process of the thin film transistor 110, the complexity of the manufacturing process can also be reduced.

For example, the Hall-effect working electrode 120 can be formed after the semiconductor pattern 113 is formed and before the source electrode 114 and the drain electrode 115 are formed. Due to a separate manufacturing step is adopted, the selection range of the material for forming the Hall-effect working electrode 120 is significantly increased, therefore, the Hall coefficient of the Hall-effect working electrode 120 can be increased, such that the signal-to-noise ratio of the Hall voltage signal and the image quality of the obtained image can be further improved.

For example, the Hall-effect working electrode 120 can also be formed in a same layer as the source electrode 114 and the drain electrode 115, in such a case, the Hall-effect working electrode 120 can be made of a conductive material. Because the manufacturing process of the Hall-effect working electrode 120 in such a case is compatible with the manufacturing process of the thin film transistor 110, the complexity of the manufacturing process can be reduced.

Figure 3:
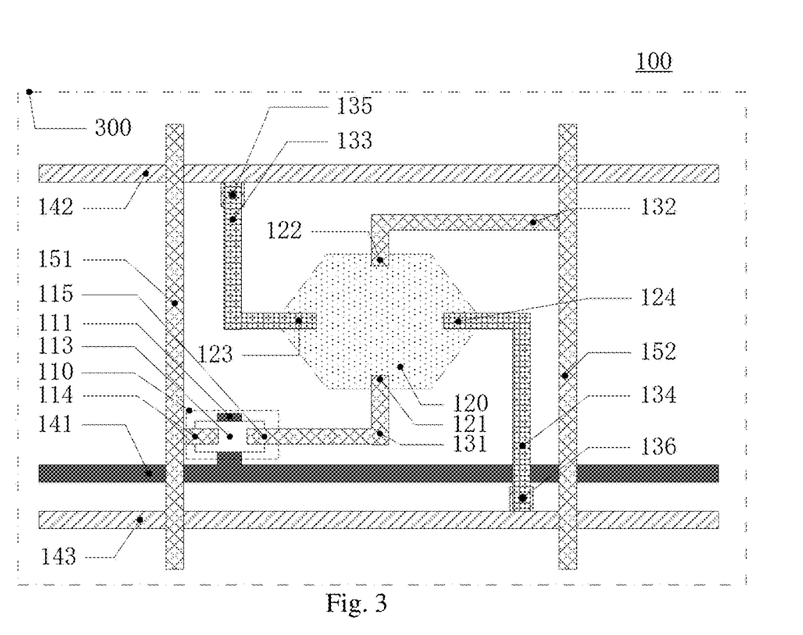
FIG. 3 is a plan view of another structure of an electronic device provided by an embodiment of the present disclosure.

For example, in the embodiment of the present disclosure, a shape of the Hall-effect working electrode 120 is not limited to rectangle illustrated in FIG. 1, but also can be hexagon illustrated in FIG. 3, or a circular shape and the like, and the shape of the Hall-effect working electrode 120 is not limited herein.

For example, in the embodiment of the present disclosure, the electronic device 100 can comprise a first connection line 131 and a second connection line 132. Two ends of the first connection line 131 are respectively electrically connected to the first contact position 121 and the drain electrode 115, and two ends of the second connection line 132 are respectively electrically connected to the second contact position 122 and the sensing line 152.

For example, in the embodiment of the present disclosure, the electronic device 100 can also comprise a third connection line 133 and a fourth connection line 134. Two ends of the third connection line 133 are respectively electrically connected to the third contact position 123 and the first common line 142, and two ends of the fourth connection line 134 are respectively electrically connected to the fourth contact position 124 and the second common line 143.

Figure 4:
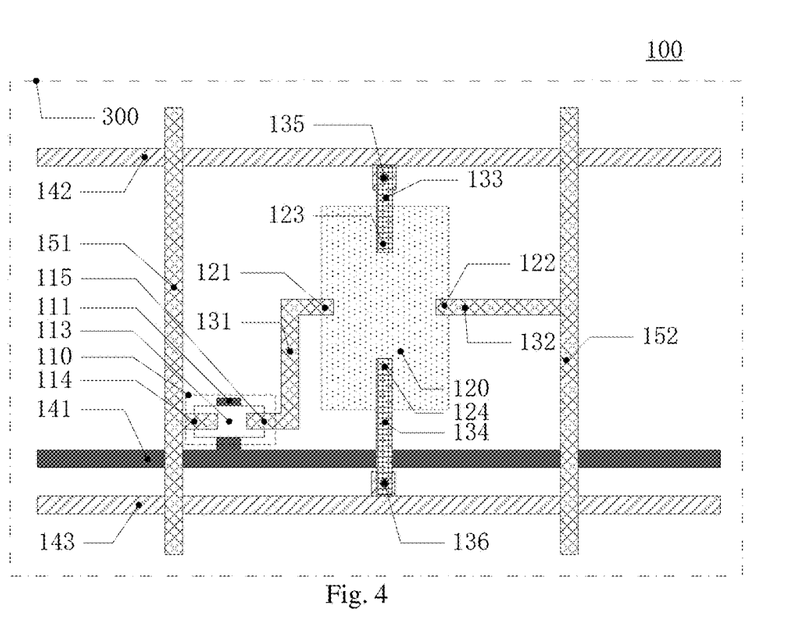
FIG. 4 is a plan view of yet another structure of an electronic device provided by an embodiment of the present disclosure.
Figure 5:
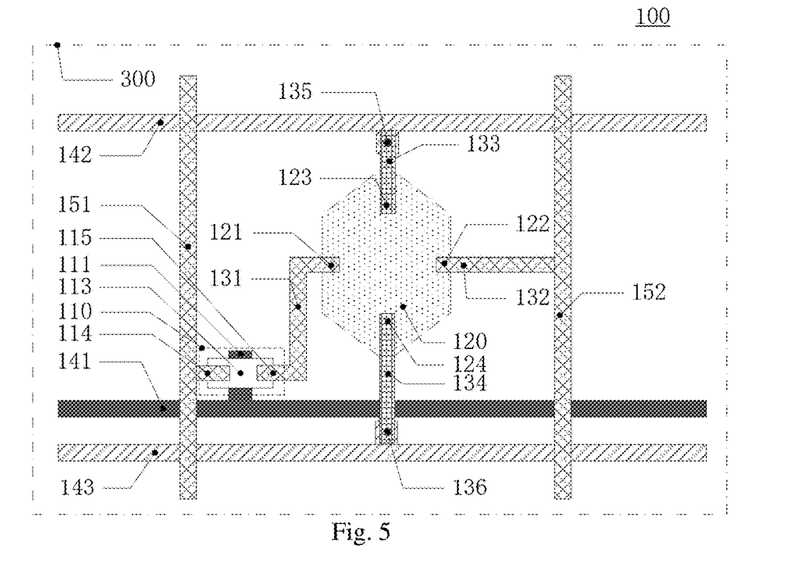
FIG. 5 is a plan view of still yet another structure of an electronic device provided by an embodiment of the present disclosure.

For example, in the embodiment of the present disclosure, the arrangements of the first connection line 131, the second connection line 132, the third connection line 133 and the fourth connection line 134 on a plane parallel to the paper surface is not limited to the arrangements illustrated in FIG. 1 and FIG. 3, and also can be arrangements illustrated in FIG. 4 and FIG. 5, no limitation will be given herein.

For example, the data line 151, the sensing line 152, the first connection line 131, the second connection line 132, the source electrode 114 and the drain electrode 115 can be formed on the base substrate including the semiconductor pattern 113 in same one process. The data line 151, the sensing line 152, the first connection line 131, the second connection line 132, the source electrode 114 and the drain electrode 115 can be formed of, for example, a metal material (such as, copper, aluminum, or aluminum alloy).

For example, as illustrated in FIG. 1 and FIG. 2, the third connection line 133 and the fourth connection line 134 can be formed in a same layer as the source electrode 114 and the drain electrode 115, or can also be formed of a different metal material after the source electrode 114 and the drain electrode 115 are formed. The third connection line 133 is electrically connected with the first common line 142 through a first contact hole 135, and the fourth connection line 134 is electrically connected with the second common line 143 through a second contact hole 136. In such a case, the third contact position 123 and the fourth contact position 124 can be directly formed (such as, lapping) on the Hall-effect working electrode 120. Therefore, the third connection line 133 and the fourth connection line 134 are electrically connected with the Hall-effect working electrode 120 directly, so as to simplify the manufacturing process.

Figure 6:
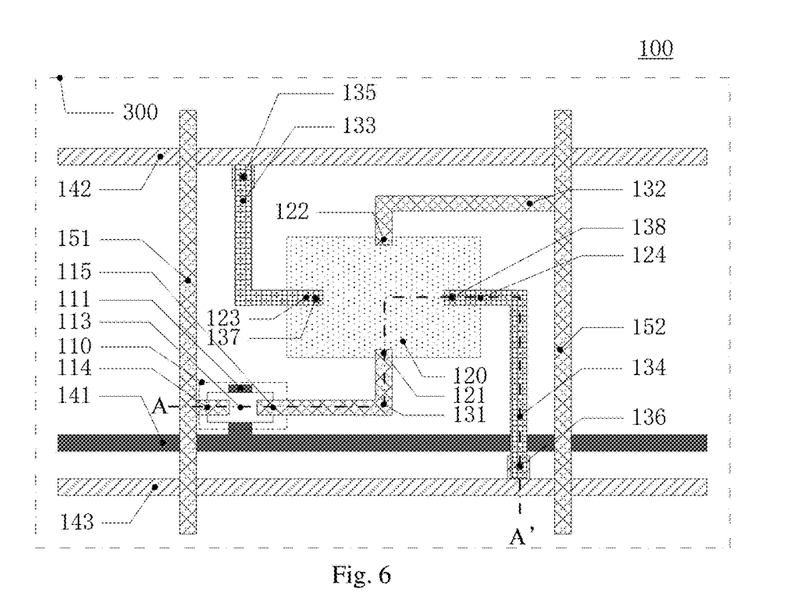
FIG. 6 is a plan view of still another structure of an electronic device provided by an embodiment of the present disclosure.
Figure 7:
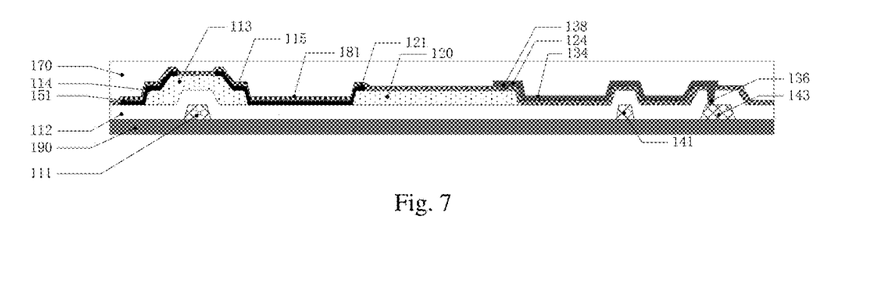
FIG. 7 is a cross-sectional view of the electronic device illustrated in FIG. 6 along an A-A' line.

For example, FIG. 6 and FIG. 7 respectively illustrate a plan view and a cross-sectional view of another structure of an electronic device 100 provided by an embodiment of the present disclosure; and the cross-sectional view illustrated in FIG. 7 is obtained by sectioning along an A-A' line illustrated in FIG. 6.

For example, as illustrated in FIG. 7, the electronic device 100 further comprises a passivation layer 181, and the passivation layer 181 is disposed on the base substrate 190 where the source electrode 114 and the drain electrode 115 are formed. For example, the passivation layer 181 can be formed of an inorganic material or an organic material. For example, the passivation layer 181 can be formed of an organic resin, silicon oxide (SiOx), silicon oxynitride (SiNxOy), or silicon nitride (SiNx). For example, as illustrated in FIG. 6 and FIG. 7, the third connection line 133 and the fourth connection line 134 also can be formed on the passivation layer 181. In such a case, the third connection line 133 is electrically connected with the first common line 142 through the first contact hole 135, the fourth connection line 134 is electrically connected with the second common line 143 through the second contact hole 136, the third connection line 133 is electrically connected with the third contact position 123 through a third contact hole 137, and the fourth connection line 134 is electrically connected with the fourth contact position 124 through a fourth contact hole 138. In this arrangement, the data line 151, the sensing line 152, the first connection line 131, the second connection line 132, the source electrode 114 and the drain electrode 115 can be protected from dust and moisture by the passivation layer.

For example, the electronic device 100 further comprises a protection layer 170, and the protection layer 170 can be disposed on a layer where the third connection line 133 and the fourth connection line 134 locate. For example, the protection layer 170 can comprise a first protection layer for preventing the erosion of dust and moisture. For example, the first protection layer can be formed of an inorganic material or an organic material. For example, the first protection layer can be formed of an organic resin, silicon oxide (SiOx), silicon oxynitride (SiNxOy), or silicon nitride (SiNx). For example, in order to planarize the surface of the electronic device 100, the protection layer 170 can further comprise a second protection layer for planarization of the surface of the electronic device 100. For example, the second protection layer can be formed by coating an organic resin. For example, when both the first protection layer and the second protection layer are formed of the organic resin, the first protection layer and the second protection layer can be formed at a same time.

For example, the electronic device 100 can further comprise a control circuit (not illustrated in figures), and the control circuit can be electrically connected with the data line 151 and the gate line 141, and is configure to apply a scan signal to the gate line 141 and receive a voltage signal outputted from the data line 151.

For example, the electronic device 100 can further comprise an analog to digital converter (not illustrated in figures) and a memory (not illustrated in figures). The analog to digital converter can be electrically connected with the data line 151 and the memory, the data line 151 outputs the Hall voltage signal, and the analog to digital converter is configured to convert the Hall voltage signal into a digital signal and transmit the digital signal to the memory.

Figure 8:
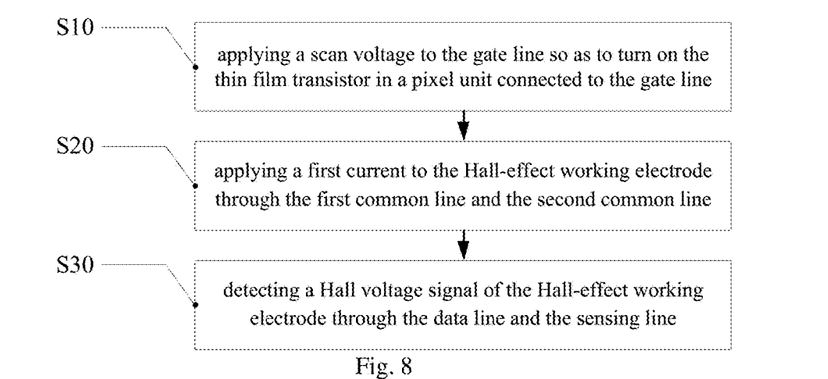
FIG. 8 is a flow chart of an operation method of an electronic device provided by another embodiment of the present disclosure.

For example, FIG. 8 is a flow chart of an operation method for the above-mentioned electronic device provided by another embodiment of the present disclosure. As illustrated in FIG. 8, the operation method can comprise the following steps:

Step S10: applying a scan voltage to the gate line, so as to turn on the thin film transistor in a pixel unit connected to the gate line;

Step S20: applying a first current to the Hall-effect working electrode through the first common line and the second common line;

Step S30: detecting a Hall voltage signal of the Hall-effect working electrode through the data line and the sensing line, in which whether this pixel unit is operated or not is determined according to the Hall voltage signal.

For example, the operation method further comprise scanning a plurality of pixel units arranged in an array, and determining whether each pixel unit is operated or not, so as to obtain an image corresponding to the plurality of pixel units.

For example, firstly, the first current is applied to the Hall-effect working electrode through the first common line and the second common line; the voltage difference between the first contact position and the second contact position are respectively $V_{ref}$ and $V_H$ in the presence of or in the absence of an magnetic field component B, in which the magnetic field component B is perpendicular to a direction of the first current I in an area where the Hall-effect working electrode locates. Then, the scan voltages are applied to the gate lines, and the thin film transistors in the pixel units connected to the gate lines are sequentially turned on, so that the voltage differences between the first contact position and the second contact position of the pixel units, where the turned-on thin film transistors locate, can be sequentially detected through the data lines. Finally, the Hall voltage signals of the Hall-effect working electrodes are detected through the data lines and the sensing lines to determine whether the pixel units where the turned-on thin film transistors locate are operated by a magnetic field or not, so that the image corresponding to the plurality of pixel units is obtained, and transformation of writing information to images is achieved.

Figure 9:
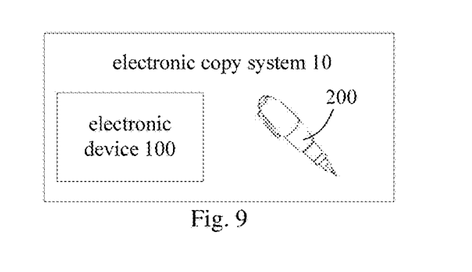
FIG. 9 is a schematic diagram of an electronic copy system provided by yet another embodiment of the present disclosure.

For example, FIG. 9 is a schematic diagram of an electronic copy system provided by yet another embodiment of the present disclosure. The electronic copy system 10 comprises a magnetic pen 200 and the electronic device 100 provided by any one of the embodiments of the present disclosure. The magnetic pen 200 comprises an operation portion (such as, a nib) made of a magnetic material. It should be noted that other indispensable components of the electronic copy system 10 should be understood by those skilled in the art, are not further described herein, and should not be construed as a limitation of the present disclosure. The electronic copy system 10 can achieve transformation of writing information to images by the Hall-effect.

For example, based on same invention concept, an embodiment of the present disclosure further provides a manufacturing method of an electronic device 100. The manufacturing method of the electronic device 100 comprises: forming a Hall-effect working electrode 120, the Hall-effect working electrode 120 comprising a first contact position 121, a second contact position 122, a third contact position 123, and a fourth contact position 124, and a line connecting the first contact position 121 and the second contact position 122 intersecting a line connecting the third contact position 123 and the fourth contact position 124; forming a thin film transistor 110, the thin film transistor 110 comprising a gate electrode 111, a source electrode 114 and a drain electrode 115, and the drain electrode 115 is electrically connected with the first contact position 121; forming a gate line 141, the gate line 141 is electrically connected with the gate electrode 111; forming a first common line 142, the first common line 142 is electrically connected with the Hall-effect working electrode 120 through the third contact position 123; forming a second common line 143, the second common line 143 is electrically connected with the Hall-effect working electrode 120 through the fourth contact position 124; forming a data line 151, the data line 151 is electrically connected with the source electrode 114; and forming a sensing line 152, the sensing line 152 is electrically connected with the second contact position 122.

Figure 10:
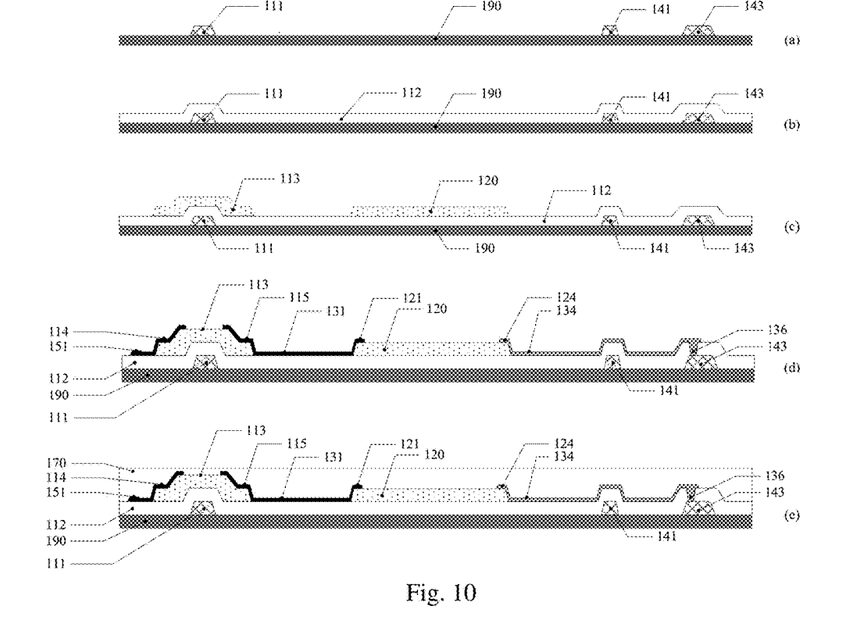
FIG. 10 is a cross-sectional view illustrating a process for manufacturing an electronic device provided by still yet another embodiment of the present disclosure.
Figure 11:
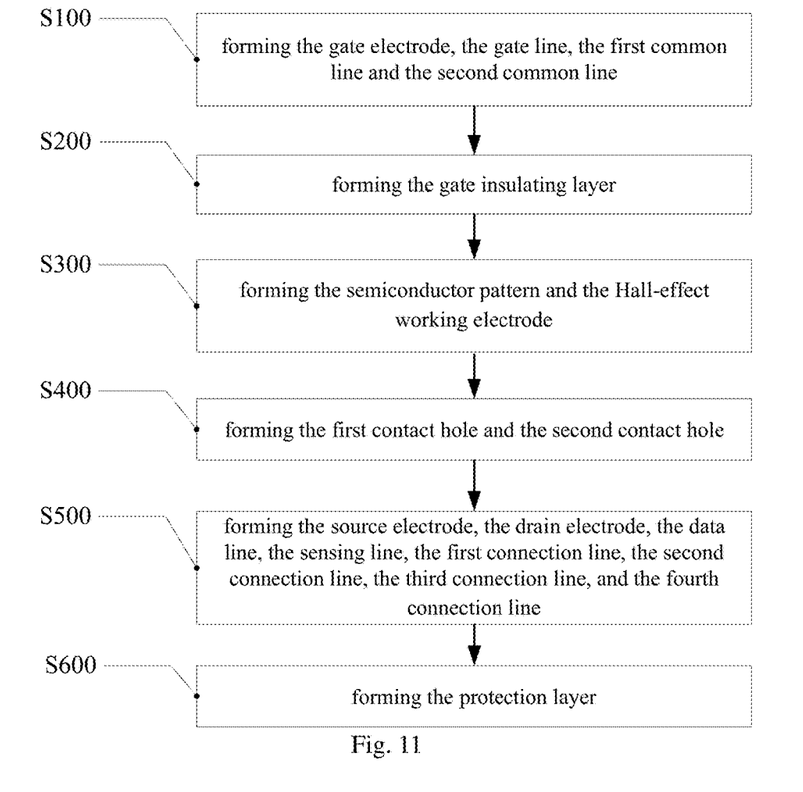
FIG. 11 is a flow chart of a manufacturing method of an electronic device provided by still another embodiment of the present disclosure.

For example, FIG. 10 is a cross-sectional view illustrating a process for manufacturing the electronic device 100 illustrated in FIG. 1, provided by still yet another embodiment of the present disclosure, and the cross-sectional view illustrated in FIG. 10 is obtained by sectioning along an A-A' line illustrated in FIG. 1. FIG. 11 is a flow chart of a manufacturing method of an electronic device, provided by still another embodiment of the present disclosure. Taking a case illustrated in FIG. 1 and FIG. 10 as an example, as illustrated in FIG. 11, the manufacturing method can comprise the following steps:

Step S100: forming the gate electrode 111, the gate line 141, the first common line 142 and the second common line 143 on the base substrate 190;

Step S200: forming the gate insulating layer 112;

Step S300: forming the semiconductor pattern 113 and the Hall-effect working electrode 120 on the gate insulating layer 112;

Step S400: forming the first contact hole 135 and the second contact hole 136 in the gate insulating layer 112;

Step S500: forming the source electrode 114, the drain electrode 115, the data line 151, the sensing line 152, the first connection line 131, the second connection line 132, the third connection line 133, and the fourth connection line 134;

Step S600: forming the protection layer 170.

For example, as illustrated in FIG. 10(a), the gate electrode 111, the gate line 141, the first common line 142 and the second common line 143 can be formed in same one patterning process, and the gate line 141 is electrically connected with the gate electrode 111. The gate electrode 111, the gate line 141, the first common line 142 and the second common line 143 can be formed of, for example, a metal material (such as, copper, aluminum, or aluminum alloy).

For example, in order to provide support and protection, the gate electrode 111, the gate line 141, the first common line 142 and the second common line 143 can be formed on the base substrate 190 in same one patterning process. The base substrate 190 can be a glass substrate, a quartz substrate, a plastic substrate (such as a polyethylene terephthalate (PET) substrate), or substrates made of other suitable materials.

For example, as illustrated in FIG. 10(b), the gate insulating layer 112 can be formed on the base substrate on which the gate line 141, the first common line 142, the second common line 143, and the gate electrode 111 are formed. For example, a material for forming the gate insulating layer 112 can be silicon oxide (SiOx), silicon oxynitride (SiNxOy), silicon nitride (SiNx) or other suitable materials.

For example, as illustrated in FIG. 10(c), the semiconductor pattern 113 and the Hall-effect working electrode 120 can be formed on the gate insulating layer 112. For example, a material for forming the semiconductor pattern 113 can be intrinsic amorphous silicon (I-a-Si), amorphous silicon (n$^+$-a-Si) doped with n$^+$ ions, hydrogenated amorphous silicon (a-Si: H), IGZO or other suitable materials. For example, the Hall-effect working electrode 120 can be formed of a conductive material or a semiconductor material. For example, a material for forming the Hall-effect working electrode 120 can be amorphous silicon, polysilicon, gallium arsenide (GaAs), indium stibide (InSb), indium arsenide (InAs), IGZO or other suitable materials.

For example, as illustrated in FIG. 10(d), firstly, the first contact hole 135 (illustrated in FIG. 1) and the second contact hole 136 can be formed in the gate insulating layer 112 at positions respectively corresponding to the first common line 142 and the second common line 143. Then, the source electrode 114, the drain electrode 115, the data line 151, the sensing line 152, the first connection line 131, the second connection line 132, the third connection line 133, and the fourth connection line 134 can be formed on the gate insulating layer 112. The first common line 142 and the second common line 143 are electrically connected with the third connection line 133 and the fourth connection line 134 through the first contact hole 135 and the second contact hole 136 respectively. Positions where the first connection line 131, the second connection line 132, the third connection line 133 and the fourth connection line 134 are in contact with the Hall-effect working electrode 120 respectively are the first contact position 121, the second contact position 122, the third contact position 123 and the fourth contact position 124. The line connecting the first contact position 121 and the second contact position 122 intersects the line connecting the third contact position 123 and the fourth contact position 124. The drain electrode 115, the sensing line 152, the first common line 142 and the second common line 143 are respectively electrically connected with the Hall-effect working electrode 120 through the first connection line 131 (contact position), the second connection line 132 (contact position), the third connection line 133 (contact position), and the fourth connection line 134 (contact position). Because the data line 151 is electrically connected with the source electrode 114, the data line 151 is electrically connected with the Hall-effect working electrode 120 through the thin film transistor 110 and the first connection line 131 (contact position).

For example, as illustrated in FIG. 10(*c*), in order to prevent the erosion of dust and moisture and/or planarize the surface of the electronic device 100, the manufacturing method further comprises forming the protection layer 170 on the source electrode 114, the drain electrode 115, the data line 151, the sensing line 152, the first connection line 131, the second connection line 132, the third connection line 133 and the fourth connection line 134. For example, the protection layer 170 can comprise a first protection layer for preventing the erosion of dust and moisture. For example, the first protection layer can be form of an inorganic material or an organic material. For example, the first protection layer can be formed of an organic resin, silicon oxide (SiOx), silicon oxynitride (SiNxOy), or silicon nitride (SiNx). For example, in order to planarize the surface of the electronic device 100, the protection layer 170 further comprises a second protection layer for planarization of the surface of the electronic device 100. For example, the second protection layer can be formed by attaching a glass substrate, a quartz substrate or a plastic substrate. For another example, the second protection layer also can be formed by coating an organic resin. For example, when both the first protection layer and the second protection layer are formed of the organic resin, the first protection layer and the second protection layer can be formed at a same time.

For example, for the electronic device 100 manufactured by the manufacturing method provided by the embodiment of the present disclosure, the first current can be applied to the Hall-effect working electrode 120 through the first common line 142 and the second common line 143, in a case that a magnetic field component B (i.e., a direction of the magnetic field component B is perpendicular to the paper surface) perpendicular to a direction of the first current I (i.e., a direction of the line connecting the third contact position 123 and the fourth contact position 124) exists in an area where the Hall-effect working electrode 120 locates, a Hall voltage V is generated in a direction perpendicular to both the first current I and the magnetic field component B. Therefore, a voltage difference between the first contact position 121 and the second contact position 122 can exist. When a scan voltage is applied to the gate line 141 and the thin film transistor 110 in a pixel unit connected to the gate line 141 is turned on, a Hall voltage signal of the Hall-effect working electrode 120 can be detected by the data line 151 and the sensing line 152, and it can be determined whether the pixel unit 300 is operated by a magnetic field or not according to the Hall voltage signal. When the plurality of pixel units 300 arranged in an array is scanned, it can be determined whether each pixel unit 300 is operated by the magnetic field or not, so that an image corresponding to the plurality of pixel units 300 can be obtained and transformation of writing information to images can be achieved.

For example, in order to further improve the signal-to-noise ratio of the Hall voltage signal and the image quality of the obtained image, a magnetic material layer can also be provided (not illustrated in FIG. 10). The magnetic material layer is disposed at a side of the Hall-effect working electrode 120 away from a working surface of the electronic device 100. In such a case, the magnetic field component B perpendicular to the first current I can be increased, so that the signal-to-noise ratio of the Hall voltage signal and the image quality of the obtained image can be improved.

For example, the magnetic material layer can be disposed on a side of the base substrate away from the Hall-effect working electrode 120, in such a case, a manufacturing process of the magnetic material layer is simple, and it is easy to repair the magnetic material layer when the magnetic force of the magnetic material layer is weakened. For example, the magnetic material layer can be disposed on a side of the base substrate closer to the Hall-effect working electrode 120 or on a side of the gate insulating layer 120 closer to the Hall-effect working electrode 120, so as to reduce the thickness of the electronic device 100. For example, an entire magnetic material layer can be provided, so that the manufacturing process is simple. For another example, the magnetic material layer can be disposed only under the Hall-effect working electrode 120, so as to avoid an influence of the magnetic field on the gate line 141, the first common line 142, the second common line 143 and the data line 151. For example, the magnetic material layer can be provided by boding. For another example, the magnetic material layer can also be obtained by firstly depositing a raw material for manufacturing a magnetic material on the base substrate or the gate insulating layer 112, and then applying a magnetic field to the raw material to allow the raw material to possess magnetism.

Apparently, the manufacturing method of the electronic device 100 provided by the present disclosure is not limited to the cases illustrated in FIG. 1 and FIG. 10, and can also comprise the cases illustrated in FIG. 6 and FIG. 7. The Hall-effect working electrode 120 is not limited to be formed in a same layer as the semiconductor pattern 113, but can also be formed in a same layer as the source electrode 114 and the drain electrode 115, or is formed after the semiconductor pattern 113 being formed and before forming the source electrode 114 and the drain electrode 115. The third connection line 133 and the fourth connection line 134 are not limited to being formed in a same layer as the source electrode 114 and the drain electrode 115, but can also be formed after the source electrode 114 and the drain electrode are formed.

An embodiment of the present disclosure provides an electronic device and a manufacturing method thereof, an electronic copy system, and an operation method of an electronic device, in which the Hall-effect is adopted to achieve transformation of writing information to images.

Although detailed description has been given above to the present disclosure with reference to general descriptions and embodiments, it shall be apparent to those skilled in the art that some modifications or improvements can be made on the basis of the embodiments of the present disclosure. Therefore, all the modifications or improvements made without departing from the spirit of the present disclosure shall fall within the scope of protection of the present disclosure.

The application claims priority to the Chinese patent application No. 201610995315.3, filed Nov. 11, 2016, the entire disclosure of which is incorporated herein by reference as part of the present application.

What is claimed is:

1. An electronic device, comprising a plurality of pixel units arranged in an array, each pixel unit comprising:
   a Hall-effect working electrode, comprising a first contact position, a second contact position, a third contact position, and a fourth contact position, wherein a line connecting the first contact position and the second contact position intersects a line connecting the third contact position and the fourth contact position;
a thin film transistor, comprising a gate electrode, a source electrode and a drain electrode, wherein the drain electrode is electrically connected with the first contact position;
a gate line, electrically connected with the gate electrode;
a first common line, electrically connected with the Hall-effect working electrode through the third contact position;
a second common line, electrically connected with the Hall-effect working electrode through the fourth contact position;
a data line, electrically connected with the source electrode; and
a sensing line, electrically connected with the second contact position.

2. The electronic device according to claim 1, wherein the line connecting the first contact position and the second contact position is perpendicular to the line connecting the third contact position and the fourth contact position.

3. The electronic device according to claim 1, further comprising a magnetic material layer, wherein
the electronic device comprises a working surface, and the magnetic material layer is disposed at a side of the Hall-effect working electrode away from the working surface.

4. The electronic device according to claim 1, further comprising a first connection line and a second connection line, wherein
two ends of the first connection line are respectively electrically connected to the first contact position and the drain electrode, and two ends of the second connection line are respectively electrically connected to the second contact position and the sensing line.

5. The electronic device according to claim 1, wherein the Hall-effect working electrode is formed of a conductive material or a semiconductor material.

6. The electronic device according to claim 5, wherein the thin film transistor further comprises a semiconductor pattern, and the Hall-effect working electrode, which is formed of the semiconductor material, and the semiconductor pattern are formed in a same layer.

7. The electronic device according to claim 5, wherein the Hall-effect working electrode, which is formed of the conductive material, is formed in a same layer as the source electrode and the drain electrode.

8. The electronic device according to claim 1, further comprising a third connection line and a fourth connection line, wherein
two ends of the third connection line are respectively electrically connected to the third contact position and the first common line, and two ends of the fourth connection line are respectively electrically connected to the fourth contact position and the second common line.

9. The electronic device according to claim 8, further comprising a protection layer, wherein
the protection layer is disposed at a side of the third connection line away from the gate electrode.

10. The electronic device according to claim 1, further comprising a control circuit, wherein
the control circuit is electrically connected with the data line and the gate line, and is configured to apply a scan signal to the gate line and receive a voltage signal outputted from the data line.

11. An operation method for the electronic device according to claim 1, comprising:
applying a scan voltage to the gate line, so as to turn on the thin film transistor in a pixel unit connected to the gate line;
applying a first current to the Hall-effect working electrode through the first common line and the second common line; and
detecting a Hall voltage signal of the Hall-effect working electrode through the data line and the sensing line, wherein whether this pixel unit is operated or not is determined according to the Hall voltage signal.

12. The operation method according to claim 11, further comprising:
scanning the plurality of pixel units arranged in an array and determining whether each pixel unit is operated or not, so as to obtain an image corresponding to the plurality of pixel units.

13. An electronic copy system, comprising the electronic device according to claim 1 and a magnetic pen.

14. The electronic copy system according to claim 13, wherein
the magnetic pen comprises an operation portion made of a magnetic material.

15. A manufacturing method of an electronic device, comprising:
forming a Hall-effect working electrode, wherein the Hall-effect working electrode comprises a first contact position, a second contact position, a third contact position, and a fourth contact position, and a line connecting the first contact position and the second contact position intersects a line connecting the third contact position and the fourth contact position;
forming a thin film transistor, wherein the thin film transistor comprises a gate electrode, a source electrode and a drain electrode, and the drain electrode is electrically connected with the first contact position;
forming a gate line, wherein the gate line is electrically connected with the gate electrode;
forming a first common line, wherein the first common line is electrically connected with the Hall-effect working electrode through the third contact position;
forming a second common line, wherein the second common line is electrically connected with the Hall-effect working electrode through the fourth contact position;
forming a data line, wherein the data line is electrically connected with the source electrode; and
forming a sensing line, wherein the sensing line is electrically connected with the second contact position.

* * * * *